(12) United States Patent
Sarda

(10) Patent No.: US 10,520,547 B2
(45) Date of Patent: Dec. 31, 2019

(54) TRANSITION SCAN COVERAGE FOR CROSS CLOCK DOMAIN LOGIC

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 73 days.

(21) Appl. No.: 15/720,858

(22) Filed: Sep. 29, 2017

(65) Prior Publication Data

US 2019/0101590 A1 Apr. 4, 2019

(51) Int. Cl.
*G01R 31/317* (2006.01)
*G01R 31/3185* (2006.01)

(52) U.S. Cl.
CPC ........... *G01R 31/31726* (2013.01); *G01R 31/318552* (2013.01); *G01R 31/318555* (2013.01); *G01R 31/318558* (2013.01); *G01R 31/318594* (2013.01)

(58) Field of Classification Search
CPC ............ G01R 31/31726; G01R 31/318594
See application file for complete search history.

(56) References Cited

U.S. PATENT DOCUMENTS

| | | | | |
|---|---|---|---|---|
| 6,115,827 A * | 9/2000 | Nadeau-Dostie | | G01R 31/31725 713/502 |
| 6,131,173 A * | 10/2000 | Meirlevede | .... | G01R 31/318594 714/726 |
| 6,269,463 B1 * | 7/2001 | Duggirala | ........ | G01R 31/31725 714/726 |
| 6,510,534 B1 * | 1/2003 | Nadeau-Dostie | | G01R 31/318552 714/724 |
| 6,904,553 B1 * | 6/2005 | Brown | ........... | G01R 31/318594 714/729 |
| 7,194,669 B2 * | 3/2007 | Nadeau-Dostie | | G01R 31/318577 714/726 |
| 7,401,279 B2 * | 7/2008 | Sumita | ................... | G11C 29/32 327/202 |
| 7,613,971 B2 * | 11/2009 | Asaka | ............. | G01R 31/31858 714/25 |
| 7,620,862 B1 * | 11/2009 | Lai | ................. | G01R 31/318519 713/500 |
| 7,752,586 B2 * | 7/2010 | Yokota | ........... | G01R 31/318357 716/113 |
| 7,900,108 B2 * | 3/2011 | Pugliesi-Conti | | G01R 31/31726 714/731 |
| 8,516,317 B2 * | 8/2013 | Nadeau-Dostie | | G11C 29/50012 714/726 |

(Continued)

OTHER PUBLICATIONS

Press, R., "Design clock controllers for hierarchical test," EDN Network, Jul. 18, 2014, 2 pages.

*Primary Examiner* — Joseph D Torres
(74) *Attorney, Agent, or Firm* — Zagorin Cave LLP

(57) ABSTRACT

In order to increase test coverage of integrated circuits with multiple clock domains, during a capture portion of a scan test, the functional clock signals, associated with a respective one of the clock domains are synchronized to ensure back and forth capture between the faster and slower clock domain. Each of the plurality of clock signals is generated such that an active edge of each faster clock signal occurs one clock period of the faster clock signal before an active edge of each slower clock signal.

20 Claims, 3 Drawing Sheets

(56) References Cited

U.S. PATENT DOCUMENTS

| | | | | |
|---|---|---|---|---|
| 9,222,981 B2* | 12/2015 | Puvvada | ........ | G01R 31/318575 |
| 9,709,629 B2* | 7/2017 | Sofer | ............. | G01R 31/318575 |
| 9,798,352 B1* | 10/2017 | Majumdar | ................ | G06F 1/10 |
| 2003/0115524 A1* | 6/2003 | Johnston | .......... | G01R 31/31727 |
| | | | | 714/726 |
| 2006/0026473 A1* | 2/2006 | Patrick Tan | ... | G01R 31/318541 |
| | | | | 714/726 |
| 2006/0069973 A1* | 3/2006 | Athavale | ........ | G01R 31/318594 |
| | | | | 714/726 |
| 2006/0107145 A1* | 5/2006 | Athavale | ........ | G01R 31/318594 |
| | | | | 714/727 |
| 2006/0282735 A1 | 12/2006 | Weinraub | | |
| 2007/0124635 A1* | 5/2007 | Yokota | ............. | G01R 31/31726 |
| | | | | 714/731 |
| 2007/0198882 A1* | 8/2007 | Namura | ........... | G01R 31/31725 |
| | | | | 714/726 |
| 2008/0282110 A1* | 11/2008 | Guettaf | .......... | G01R 31/318552 |
| | | | | 714/30 |
| 2009/0113265 A1 | 4/2009 | Cannon | | |
| 2009/0187801 A1* | 7/2009 | Pandey | .......... | G01R 31/318558 |
| | | | | 714/729 |
| 2011/0099442 A1* | 4/2011 | Hales | ............. | G01R 31/318533 |
| | | | | 714/729 |
| 2012/0249204 A1* | 10/2012 | Nishioka | .......... | G01R 31/31726 |
| | | | | 327/202 |
| 2014/0075257 A1* | 3/2014 | Wang | ................. | G06F 17/5045 |
| | | | | 714/731 |
| 2016/0178695 A1 | 6/2016 | Zhang | | |
| 2017/0115352 A1* | 4/2017 | Jayaraman | ....... | G01R 31/31701 |

* cited by examiner

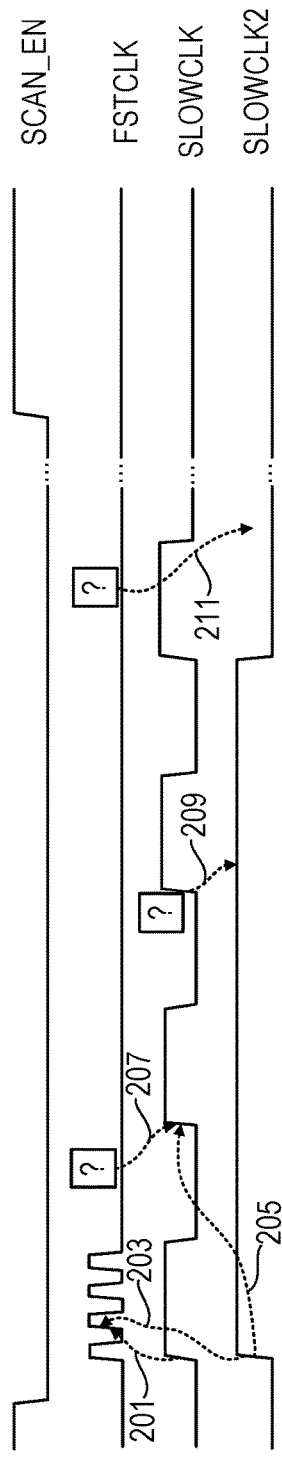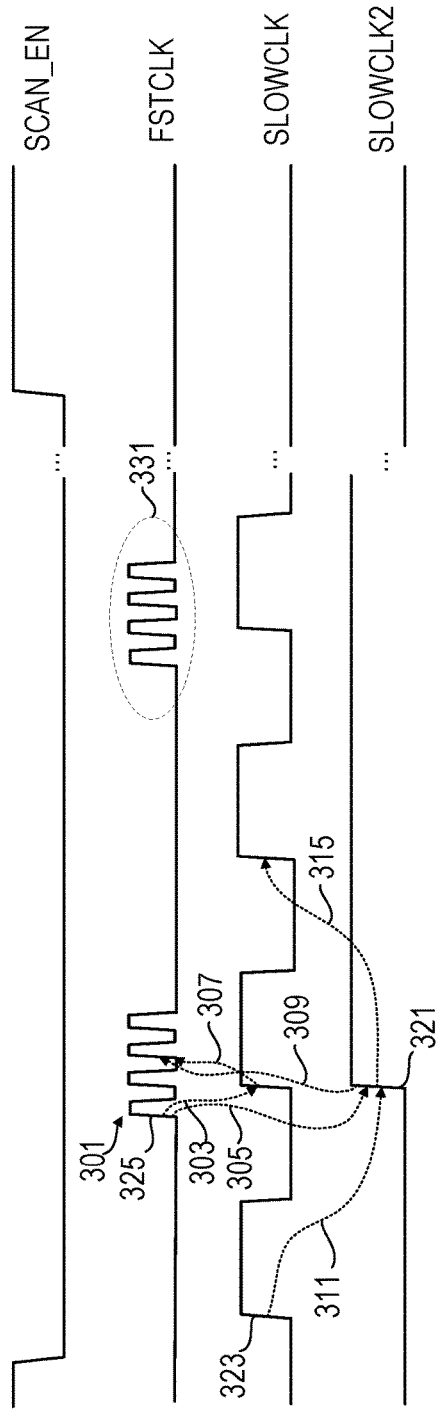

TRANSITION SCAN COVERAGE FOR CROSS CLOCK DOMAIN LOGIC

BACKGROUND

Field of the Invention

This invention relates to scan testing and more particularly to testing integrated circuits with multiple clock domains.

Description of the Related Art

Scan testing provides testing of stuck-at and dynamic faults in integrated circuits. Storage elements such as flip-flops are configured in one or more scan strings and a test pattern is serially shifted into the scan strings during a shift phase of the testing. The storage elements are then configured back into functional mode and the integrated circuit is operated at speed by providing one or more functional clocks during a capture phase of the testing. The storage elements are then configured back into a scan mode (corresponding to the shift portion of scan test) and the results of the at speed testing are shifted to an evaluation device, e.g., automatic test equipment (ATE), to determine if the test was successful.

FIG. 1 illustrates a simplified diagram of a portion of an integrated circuit illustrating how logic is configured for a shift portion of a scan test and a capture portion. While two flip-flops are shown for ease of illustration, each integrated circuit can have multiple scan strings with thousands of storage elements in each scan string. In functional mode, flip-flop 101 receives an input 120 and supplies its output as an input to combinational logic 103, which in turn supplies flip flop 105 with an input signal 107 through multiplexer 109. The combinational logic 103 receives other inputs 111 and 115, e.g., from other flip-flops and/or other combinational logic. As shown in FIG. 1, the flip-flops 101 and 105 receive different capture clocks. Flip-flop 101 receives FASTCLK 117 and flip flop 105 receives SLOWCLK 118. FASTCLK and SLOWCLK represent different clock domains.

With scan enable (SCANEN) asserted, the output of flip-flop 101 supplies the input of flip-flop 105 through multiplexer 109. Note that in some embodiments, flip-flops in one clock domain are in a separate scan chain than from flip-flops in another clock domain. In the embodiment of FIG. 1, in scan mode the flip-flops receive a scan clock 119 rather than the capture clocks 117 and 118. The scan clock 119 typically has a lower frequency than the capture clocks. During the shift portion of the scan test, values are shifted into the flip-flops including the flip-flops 101 and 105. After scan enable deasserts one or more series of capture clocks 117 and 118 are then applied. The logic then enters shift mode again and the results are shifted out to be evaluated by the ATE. The process is repeated until testing has provided sufficient test coverage to detect a desired percentage of defects.

Transition coverage (functional clocks run at speed) checks for faults by scanning in a stimulus pattern to cause a transition in the logic value being stored in the storage element from 1 to 0 or 0 to 1 as a result of supplying the capture clock(s). The testing detects if there is too long a delay in the critical path resulting in the expected value not reaching its destination. Increasing transition scan coverage would be desirable to more easily detect errors related to critical path timing failures.

SUMMARY OF EMBODIMENTS OF THE INVENTION

In order to close transition coverage gaps for devices under test having multiple clock domains, the various clock domain capture clocks are synchronized to increase coverage.

In an embodiment, a method for testing a device with multiple clock domains, includes generating a first clock signal having a first clock signal first active edge occurring at a first time relative to deassertion of a scan enable signal and having a first clock signal second rising edge occurring at a second time after the first time. The method further includes generating a second clock signal having a second clock signal first active edge occurring one second clock signal period before the second time and generating a third clock signal having a third clock signal first active edge occurring at the second time.

In another embodiment, an integrated circuit includes a plurality of on-chip clock control circuits coupled to receive an input clock signal and to generate a plurality of clock signals having different frequencies during a capture portion of a scan test. An active edge of each faster clock signal of the plurality of clock signals, occurs one clock cycle of the faster clock signal before an active edge of each slower clock signal.

In an embodiment, a method for testing a device with multiple clock domains, includes generating a plurality of clock signals during a capture portion of a scan test, each of the plurality of clock signals associated with a respective one of a plurality of clock domains. The method further includes generating each of the plurality of clock signals such that an active edge of each faster clock signal of the plurality of clock signals occurs one clock period of the faster clock signal before an active edge of each slower clock signal of the plurality of clock signals.

BRIEF DESCRIPTION OF THE DRAWINGS

The present invention may be better understood, and its numerous objects, features, and advantages made apparent to those skilled in the art by referencing the accompanying drawings.

FIG. 2 shows a timing diagram illustrating the problems associated with failing to synchronize the capture clocks for cross domain signals.

FIG. 3 illustrates a timing diagram showing how capture clocks can be synchronized to improve transition scan coverage.

The use of the same reference symbols in different drawings indicates similar or identical items.

DETAILED DESCRIPTION

Figure 1:
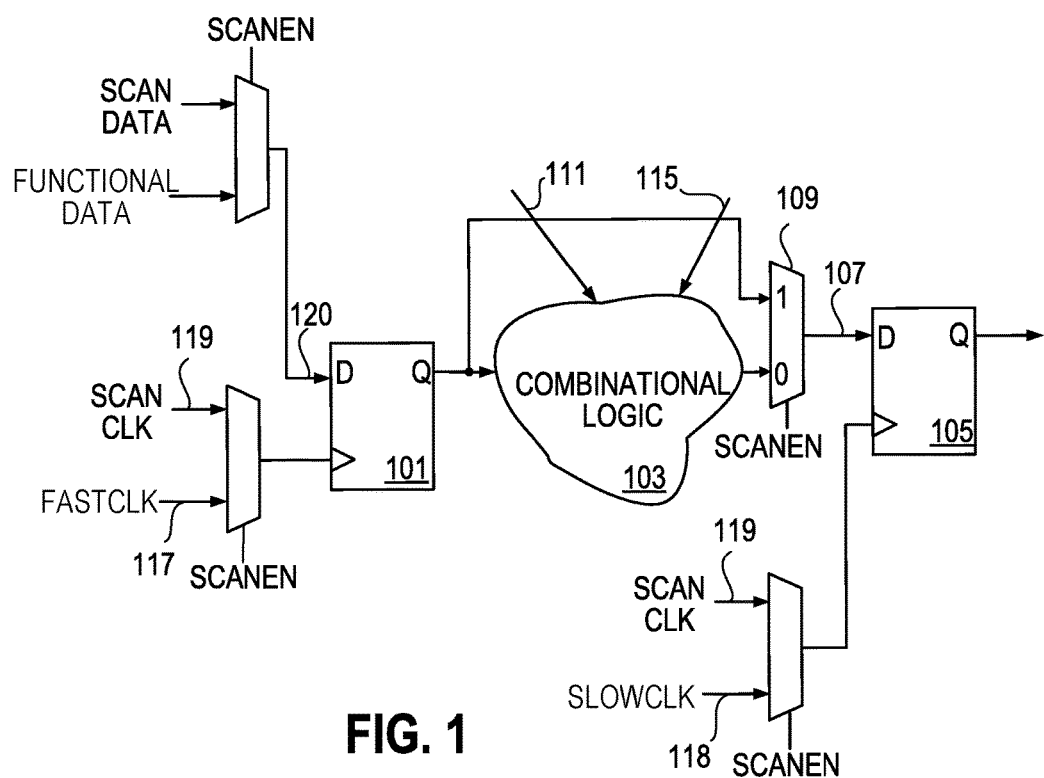
FIG. 1 illustrates a high level diagram of a portion of scan logic in an integrated circuit in which flip-flops are clocked by different functional clocks.

The capture clock controllers used in conventional designs can completely miss cross clock domain crossings because the capture clock bursts are not synchronized. Synchronizing the capture clocks in the clock controllers provides significant coverage improvement in designs where data is transferred across multiple clock domains. The synchronization of capture clock bursts allows more digital logic to be covered during transition scan allowing, e.g., the strict test requirements for Automotive Electronics Council (AEC) qualifications to be more easily met.

FIG. 2 illustrates the problem when the clock controllers fail to synchronize the capture clocks for cross domain signals. The example of FIG. 2, provides three clock domains, FSTCLK, SLOWCLK, and SLOWCLK2. FASTCLK is eight times faster than SLOWCLK and 24 times faster than SLOWCLK2. Each clock signal includes a pulse train of four complete periods (only one complete period shown for SLOWCLK2). The second active edge (here a rising edge) of FSTCLK captures the change in value caused by the transition on the first active edge of SLOWCLK, as indicated at 201. Similarly, the second active edge of FSTCLK captures the change in value caused by the transition on the first active edge of SLOWCLK2 as indicated by 203. Finally, the second active edge of SLOWCLK captures the change in value caused by the transition on the first active edge of SLOWCLK2 as indicated by 205.

However, the clock timing shown in FIG. 2 fails to account for other cross clock domain transitions. For example, the SLOWCLK domain captures a transition from the FSTCLK domain at 207 but only after a time period that is many clock periods of the FSTCLK cross domain. That provides a false sense of security that a critical timing path from the FSTCLK to the SLOWCLK domain works satisfactorily. Similarly, the SLOWCLK2 domain fails to capture a transition from the SLOWCLK domain, e.g., at 209, until long after the transition in the SLOWCLK domain occurs. The SLOWCLK2 domain fails to capture a transition from the FSTCLK domain, e.g., at 211 until long after the transition in the FSTCLK domain occurs. In short, the clocks signals shown in FIG. 2 miss capturing at speed some of the data transfers between clock domains resulting in gaps in transition scan coverage.

In order to address the coverage problems shown in FIG. 2, FIG. 3 illustrates a solution that synchronizes the clock domains thereby providing better back and forth transition coverage between clock domains. The system provides "information" to the related clock domain to "sync" up and capture data transfers back and forth between domains at speed. That information used to sync up can be a control signal and/or the capture clock itself. As explained more fully herein, that information can be used to align clock signals generally by delaying them until an appropriate time to achieve better at speed transition scan coverage.

FIG. 3 illustrates an embodiment providing better at speed transition coverage between clock domains. As compared to FIG. 2, the FASTCLK pulse train 301 moves with respect to the SLOWCLK and the SLOWCLK2 pulse trains. In addition, the SLOWCLK2 pulse train moves with respect to the SLOWCLK pulse train. In the specific embodiment of FIG. 3, the first active edge of FSTCLK occurs one FSTCLK period before the second active edge of SLOWCLK and the first active edge of SLOWCLK2. That allows transitions resulting from the active edge of FSTCLK to be captured at speed (one FSTCLK period) by both SLOWCLK and SLOWCLK2 as indicated by 303 and 305. In addition, FSTCLK captures at speed (one FSTCLK period) transitions resulting from the second active edge of SLOWCLK and the first active edge of SLOWCLK2 as indicated by 307 and 309. SLOWCLK2 captures at speed (one SLOWCLK period) transitions resulting from the first active edge of SLOWCLK as indicated by 311. Finally, SLOWCLK captures at speed (one SLOWCLK period) transitions resulting from the first active edge of SLOWCLK2 as indicated at 315. Thus, the synchronization of the capture clocks allows data transfers in both directions to be captured at speed.

In the embodiment of FIG. 3, the synchronization places an active edge of each faster clock one clock period of the faster clock before an active edge of each slower clock. Thus, e.g., in the example of FIG. 3, the first active edge of FASTCLK occurs one clock period of FSTCLK before active edges of both SLOWCLK and SLOWCLK2. The first active edge of SLOWCLK occurs one SLOWCLK period before the active edge of SLOWCLK2. That ensures transitions from the fast clock domain can be captured by the slower clock domains. In addition, the pulse trains of the faster clocks have to be long enough to ensure that the faster clock domains capture transitions from the slower clock domains. In the example of FIG. 3, a pulse train of four pulses of FSTCLK ensures the FSTCLK domain captures transfers (at the third FSTCLK pulse) from both the SLOWCLK domain and SLOWCLK2 domain. Four pulses of SLOWCLK ensure that the third pulse of SLOWCLK captures transitions caused by first active edge of SLOWCLK2. Note that the active edges of FSTCLK, SLOWCLK, and SLOWCLK2 are all rising edges. The active edge is the edge which clocks data into the flip-flops or other storage elements. In other embodiments, some or all of the active edges may instead be falling edges.

Figure 4:
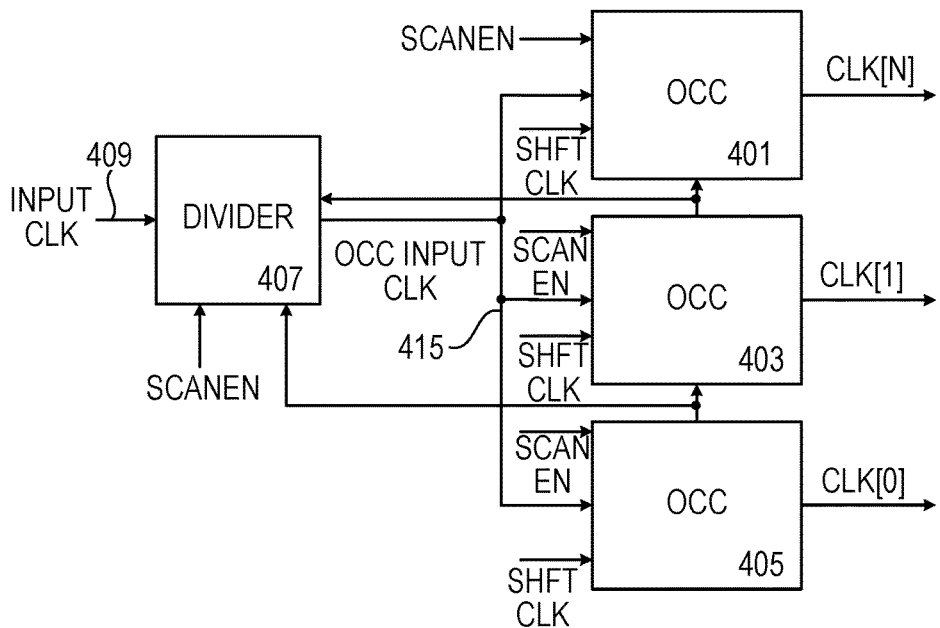
FIG. 4 illustrates an embodiment using a clock controller for each clock domain to synchronize capture clocks across the clock domains.

In order to synchronize the clock signals, in an embodiment information has to be supplied to the clock control logic supplying the capture clocks. Referring to FIG. 4, in an embodiment, on chip clock controllers (OCCs) 401, 403, and 405 supply clocks to three separate clock domains. For example, CLK[N] may correspond to FSTCLK, CLK[1] to SLOWCLK, and CLK[0] to SLOWCLK2. Embodiments with additional clock domains may require additional OCCs. In an embodiment, each OCC receives a clock signal (OCC INPUT CLK) from a divider 407. Divider 407 receives an input clock signal 409 from, e.g., clock generation logic on chip such as a phase-locked loop, or from an external source and divides the clock signal to a frequency suitable for distribution to the OCCs. In some embodiments, the OCCs receive the OCC INPUT CLK signal directly from an external source.

Figure 5:
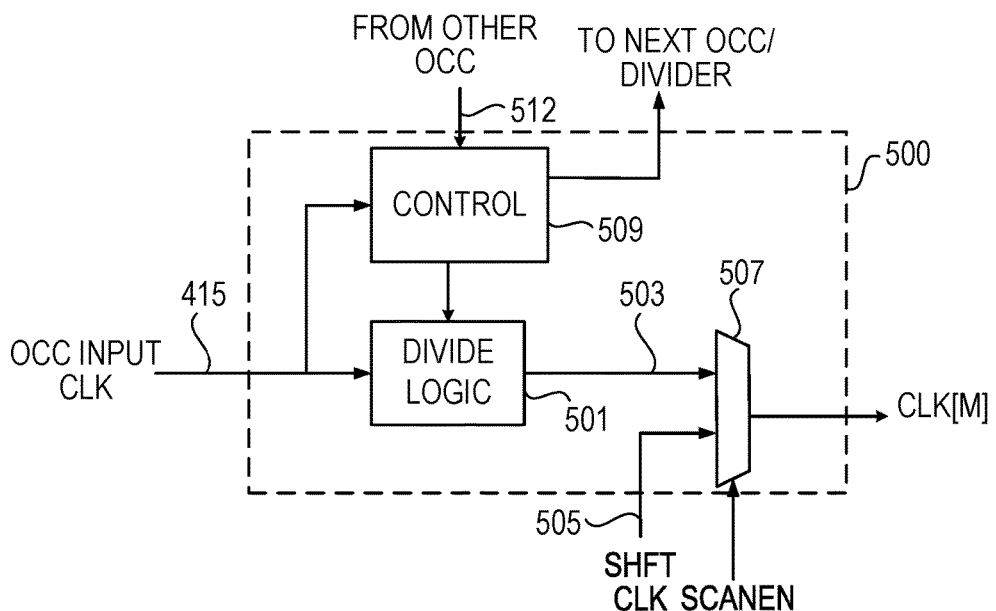
FIG. 5 illustrates a high level block diagram of an embodiment of an on-chip clock controller.

FIG. 5 illustrates a high level block diagram of an example of OCC 500, which represents an embodiment of OCCs 401, 403, and 405. OCC 500 divides the INPUT CLK 415 in divider logic 501 down to the desired frequency. For example, the divider logic 501 divides OCC INPUT CLK 415 by one in OCC 401, by 8 in OCC 403, and by 24 in OCC 405 to achieve the clock relative frequencies shown in FIG. 2. In addition, OCC 500 selects between the divided clock signal 503 and the shift clock 505 in multiplexer 507 to provide either the shift clock or a functional clock to the storage elements of the clock domain. The scan enable signal SCANEN selects between the two.

Each OCC also includes a control logic 509 that aligns the clock signals to ensure achieving appropriate synchronization for cross clock domain signals. In an example, flip-flops in the control logic 509 are initialized during the shift portion of the scan test. That allows increased coverage since the control logic functions are tested. In other embodiments, the control logic may be loaded and/or controlled using another interface and not be included in the scan test. The control logic determines when the first edge of the clock should be provided and provides information to an adjacent OCC that the adjacent OCC uses to determine when to provide the adjacent faster capture clock signal. The control logic 509 receives information 512 from an OCC for a slower clock signal for use in generating an appropriately synchronized capture clock signal.

In the embodiment of FIG. 4, the OCC supplying the slowest clock provides information to the next fastest clock OCC used to determine when to provide the faster clock. The information includes edge relationship information between all clocks in order to setup and generate the correct configuration for control logic 509 and divide logic 501. The edge relation indicates when each edge should come out with relation to another edge and/or with respect to the input clock. For example, with reference to FIGS. 3 and 4 and assuming the outputs of the OCCs in FIG. 4 correspond to the timing diagram of FIG. 3, OCC 405 supplying SLOW-CLK2 receives control information telling it to provide four cycles of SLOWCLK2. That information may be scanned in or loaded via another interface. In addition, OCC 405 receives information to supply the first clock edge of SLOWCLK2 at 321. That may be accomplished, e.g., by counting a number (supplied to OCC 405) of OCC INPUT CLK cycles from the falling edge of SCAN EN. Rather than providing the information, the edge relationships may be designed into the control logic and dividers for a specific design. In an embodiment, the control logic uses a counter (not shown) to count the appropriate number of cycles of OCC INPUT CLK 415 to delay before supplying the first edge of the capture clock 503 to multiplexer 507 from divide logic 501. Thus, the OCC input clock may be gated off in the divider logic until the right clock edge is reached as determined by the counter to ensure the OCC 405 supplies the first active clock edge at 421. Once SLOWCLK2 starts, a separate counter may be used to count the number of cycles desired, e.g., four cycles until the capture clock 503 is turned off in divide logic 501. In an embodiment, the control logic 501 utilizes a state machine in conjunction with counters to control the divide logic to start the pulse train the proper number of OCC INPUT CLK 415 cycles after scan enable is deasserted, provide a desired number of pulses, and stop after the desired number of pulse to provide the desired edge relationships such as shown in FIG. 3.

The control logic also supplies an indication to the OCC of a faster clock when to provide the faster clock. For example, with reference to FIG. 4, the OCC 405 provides OCC 403 information indicating when the first edge of SLOWCLK2 is being provided so OCC 403 knows when to supply the first edge of SLOWCLK. The information provided includes edge relationship information between all clocks sufficient to setup and generate the right configuration for the control logic and the divider logic in the OCC. In the example shown in FIGS. 3 and 4, the OCC 403 provides the first edge of SLOWCLK one SLOWCLK cycle before the first edge of SLOWCLK2. The control logic in OCC 405 supplies the first edge of its capture clock one cycle before the edge of SLOWCLK2. Thus, in an embodiment, OCC subtracts the number of OCC INPUT CLK cycles corresponding to one SLOWCLK period from the start time of SLOWCLK2 and counts until the time corresponding to rising edge 323 at which time the OCC supplies the first active edge of SLOWCLK. A separate counter is used to count the specified number of clock pules, e.g., four, after which the OCC 403 turns off its capture clock.

Similarly, OCC 403 supplies an indication to OCC 401 as to when OCC 403 is supplying its first edge. The information provided includes edge relationship information between all clocks sufficient to setup and generate the right configuration for the control logic and the divider logic in the OCC. Because multiple clock cycles of the clocks are provided, e.g., four, data transitions caused by the first rising edge 325 of FSTCLK can be sampled by SLOWCLK and SLOW-CLK2 and transitions caused by the second rising edge of SLOWCLK and the first rising edge of SLOWCLK 2 can be captured by the third rising edge of FASTCLK. Further, as shown in FIG. 3, the first rising edge of SLOWCLK2 captures data transitions caused by the first rising edge of SLOWCLK. The third rising edge of SLOWCLK captures transitions caused by the first rising edge of SLOWCLK2.

In the examples discussed above, the various clock signals are integer multiples, e.g., FSTCLK has a frequency 24 times faster than SLOWCLK2 and 8 times faster than SLOWCLK. In other embodiments, the clock signals may not be integer multiples but have a common multiple. In such embodiments, with three clocks, the first edge of the slowest clock would occur at the common multiple, and the remaining clocks would be synchronized to ensure each faster clock occurs one clock cycle of the faster clock before each slower clock and the pulse train is long enough to capture pulses going from slow to fast to provide the correct chain of clocks to improve transition scan coverage.

Note that the OCCs may also provide information to divider 407. For example, the divider 407 may adjust the phase of the OCC INPUT CLK signal or cause the supplied OCC INPUT CLK signal to start on a negative or positive edge. In an embodiment, the edge relationship information between all clocks is provided at setup and a phase adjustment is performed in the divider 407, if needed, to provide the appropriate positive or negative edge.

In other embodiments, to allow simpler circuits, the fast clocks are simply repeated near the slower clock edge for every clock domain. That achieves a simpler design but at the cost of increasing the complexity for the ATPG tool and also increases power during scan. For some unrelated divided clocks (for example /32 and /37), synchronization requires manual intervention. If the pulse train for the clocks can be controlled, multi cycle paths that land within a cycle (maximum−minimum delay<1 cycle) can also be computed for coverage. With reference again to FIG. 4, some embodiments include additional pulse trains, e.g., at 331, to provide capture depth. For example, certain logic structures such as first-in first-out (FIFO) structures may not be scannable. Thus, e.g., for a FIFO with a depth of eight, eight clock pulses ensure a test input of the FIFO reaches a FIFO output.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Thus, various aspects have been described relating to improving test coverage for signals crossing clock domains. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit comprising:
    a plurality of on-chip clock control circuits coupled to receive an input clock signal and to generate a plurality of clock signals having different frequencies during a capture portion of a scan test; and
    wherein an active edge of each faster clock signal of the plurality of clock signals, occurs one clock cycle of each faster clock signal before an active edge of each slower clock signal.

2. The integrated circuit as recited in claim 1 wherein the active edge of each faster clock signal is a first active edge, relative to deassertion of a scan enable signal, of each faster clock signal of the plurality of clock signals.

3. The integrated circuit as recited in claim 1 wherein each of the plurality of clock signals are associated with a respective one of a plurality of clock domains.

4. The integrated circuit as recited in claim 3 wherein for a signal originating in a first clock domain of the clock domains responsive to a first clock signal active edge of a first clock signal and captured in a second clock domain of the clock domains responsive to a second clock signal active edge of a second clock signal, the first clock signal being faster than the second clock signal, one clock period of the first clock signal being provided between the first clock signal active edge and the second clock signal active edge.

5. The integrated circuit as recited in claim 4, further comprising:
    a first on-chip clock control circuit of the plurality of on-chip clock control circuits generating the first clock signal;
    a second on-chip clock control circuit of the plurality of on-chip clock control circuits generating the second clock signal;
    a third on-chip clock control circuit generating a third clock signal that is slower than the second clock signal; and
    wherein an active edge of the second clock signal is one second clock signal period before an active edge of the third clock signal.

6. A method for testing a device with multiple clock domains, comprising:
    generating a plurality of clock signals, during a capture portion of a scan test, each of the plurality of clock signals associated with a respective one of a plurality of clock domains; and
    generating each of the plurality of clock signals such that an active edge of each faster clock signal of the plurality of clock signals occurs one clock period of each faster clock signal before an active edge of each slower clock signal of the plurality of clock signals.

7. The method as recited in claim 6 further comprising wherein the active edge of each faster clock signal is a first active edge.

8. The method as recited in claim 6 further comprising generating each of the plurality of clock signals such that the active edge of each faster clock signal of the plurality of clock signals, occurs one clock cycle of each faster clock signal before the active edge of each slower clock signal.

9. The method as recited in claim 6, further comprising:
    generating the clock signals so a capture from a first clock domain to a second slower clock domain and from the second slower clock domain to the first clock domain provides one clock period of a first clock domain clock signal between an active edge of the first clock domain clock signal and an active edge of a second slower clock domain clock signal.

10. The method as recited in claim 6, further comprising:
    providing information from a first on-chip clock control circuit generating a slowest clock signal of the plurality of clock signals to at least a second on-chip clock control circuit supplying another of the plurality of clock signals, the information being used to generate a first edge of the other of the plurality of clock signals.

11. The method as recited in claim 6 wherein the plurality of clock signals have a common multiple.

12. The method for testing a device with multiple clock domains as recited in claim 6, further comprising:
    generating as one of the plurality of clock signals a first clock signal having a first clock signal first active edge occurring at a first time relative to deassertion of a scan enable signal and having a first clock signal second active edge occurring at a second time;
    generating as one of the plurality of clock signals a second clock signal having a second clock signal first active edge occurring one second clock signal period before the second time; and
    generating as one of the plurality of clock signals a third clock signal having a third clock signal first active edge occurring at the second time.

13. The method as recited in claim 1, wherein the second clock signal is faster than the first clock signal and the third clock signal is slower than the first clock signal.

14. The method as recited in claim 1, further comprising:
    supplying the second clock signal with the second clock signal first active edge occurring one second clock signal period before the second time.

15. The method as recited in claim 12, further comprising:
    generating the second clock signal in a first on-chip clock control circuit;
    generating the first clock signal in a second on-chip clock control circuit;
    generating the third clock signal in a third on-chip clock control circuit; and
    supplying an input clock signal to the first, second, and third on-chip clock control circuits.

16. The method as recited in claim 15, further comprising:
    supplying first information from the third on-chip clock control circuit to the second on-chip clock control circuit and using the first information to determine when to supply the first clock signal first active edge; and
    supplying second information from the second on-chip clock control circuit to the first on-chip clock control circuit and using the second information to determine when to supply the second clock signal first active edge.

17. The method as recited in claim 16, further comprising:
    supplying the first information from the third on-chip clock control circuit to a divider circuit supplying an input to the third on-chip clock control circuit; and
    the divider circuit adjusting an edge of the input clock signal based on, at least in part, the first information.

18. The method as recited in claim 15, further comprising:
generating at least N clock cycles of the first clock signal, the second clock signal, and the third clock signal, where N is an integer of one or more, after the scan enable signal is deasserted and before the scan enable signal is reasserted to scan out capture results.

19. The method as recited in claim 18, wherein the at least N clock cycles are associated with a capture portion of a scan test and the method further comprising varying a value of N for at least one of the first clock signal, the second clock signal, and the third clock signal for a subsequent capture portion.

20. The method as recited in claim 15, further comprising:
generating more clock cycles of the first clock signal than the second clock signal and the third clock signal.

* * * * *